(12) United States Patent
Lee et al.

(10) Patent No.: US 12,188,126 B2
(45) Date of Patent: Jan. 7, 2025

(54) SUBSTRATE PROCESSING APPARATUS

(71) Applicant: JUSUNG ENGINEERING CO., LTD., Gwangju-si (KR)

(72) Inventors: Jae Wan Lee, Gwangju-si (KR); Yong Hyun Kim, Gwangju-si (KR); Yoon Jeong Kim, Gwangju-si (KR); Yun Hoe Kim, Gwangju-si (KR); Chang Kyun Park, Gwangju-si (KR); Gu Hyun Jung, Gwangju-si (KR); Ki Bum Kim, Gwangju-si (KR); Seung Youb Sa, Gwangju-si (KR); Chul Joo Hwang, Gwangju-si (KR)

(73) Assignee: JUSUNG ENGINEERING CO., LTD. (KR)

(*) Notice: Subject to any disclaimer, the term of this patent is extended or adjusted under 35 U.S.C. 154(b) by 262 days.

(21) Appl. No.: 17/624,565

(22) PCT Filed: Jun. 11, 2020

(86) PCT No.: PCT/KR2020/007614
§ 371 (c)(1),
(2) Date: Jan. 3, 2022

(87) PCT Pub. No.: WO2021/002605
PCT Pub. Date: Jan. 7, 2021

(65) Prior Publication Data
US 2022/0275514 A1   Sep. 1, 2022

(30) Foreign Application Priority Data
Jul. 2, 2019  (KR) .................. 10-2019-0079657

(51) Int. Cl.
*C23C 16/509*   (2006.01)
*H01J 37/32*    (2006.01)

(52) U.S. Cl.
CPC ....... *C23C 16/509* (2013.01); *H01J 37/32568* (2013.01); *H01J 2237/036* (2013.01)

(58) Field of Classification Search
None
See application file for complete search history.

(56) References Cited

U.S. PATENT DOCUMENTS 6,883,733 B1 * 4/2005 Lind ................. C23C 16/45574
                                                        239/423
7,883,602 B2 * 2/2011 Dong .................. B23K 35/268
                                                       156/345.51

(Continued)

FOREIGN PATENT DOCUMENTS

JP      2010103455 A    5/2010
KR      100752525 B1    8/2007

(Continued)

OTHER PUBLICATIONS

International Search Report for PCT/KR2020/007614 mailed Sep. 25, 2020.

*Primary Examiner* — Sylvia MacArthur
(74) *Attorney, Agent, or Firm* — Renaissance IP Law Group LLP

(57) ABSTRACT

Provided is a substrate processing apparatus. The positions of a first electrode and a second electrode are adjusted in advance in consideration of differences in coefficients of thermal expansion so that a short circuit created by contact between the first electrode and the second electrode is prevented even in the case in which the first electrode and the second electrode are thermally expanded during processing. Even in the case in which the first electrode and the second electrode are thermally expanded due to an increase in temperature during processing, a short circuit between the first electrode and the second electrode can be prevented, and the uniformity of a thin film can be maintained in the (Continued)

substrate processing apparatus for processing a large substrate.

10 Claims, 7 Drawing Sheets

(56) References Cited

U.S. PATENT DOCUMENTS

| | | | | |
|---|---|---|---|---|
| 8,910,591 | B2* | 12/2014 | Kiehlbauch | H01J 37/32091 |
| | | | | 156/345.47 |
| 2004/0261712 | A1* | 12/2004 | Hayashi | H01L 21/67069 |
| | | | | 118/723 E |
| 2009/0178615 | A1* | 7/2009 | Kim | C23C 16/45565 |
| | | | | 118/715 |
| 2011/0086513 | A1 | 4/2011 | Llera et al. | |
| 2015/0303037 | A1* | 10/2015 | Ha | H01J 37/3244 |
| | | | | 118/723 R |
| 2022/0275514 | A1* | 9/2022 | Lee | C23C 16/45574 |

FOREIGN PATENT DOCUMENTS

| | | | | |
|---|---|---|---|---|
| KR | 20110104847 A * | 9/2011 | | C23C 16/5096 |
| KR | 101160906 B1 | 6/2012 | | |
| KR | 20140084906 A | 7/2014 | | |
| WO | WO-2019212270 A1 * | 11/2019 | | C23C 16/452 |

\* cited by examiner

SUBSTRATE PROCESSING APPARATUS

BACKGROUND

1. Technical Field

The present disclosure relates to a substrate processing apparatus, and more particularly, to a substrate processing apparatus devised in consideration of differences in coefficients of thermal expansion so as to prevent a short circuit between electrodes.

2. Related Art

In general, a thin-film layer, a thin-film circuit pattern, or an optical pattern needs to be provided on a substrate in order to fabricate a semiconductor device, a flat panel display, a solar or photovoltaic cell, or the like. In this regard, substrate processing processes, such as a deposition process of depositing a thin film formed of a specific material on the substrate, a photolithography process of selectively exposing the thin film using a photosensitive material, and an etching process of forming a pattern by selectively removing the exposed portions of the thin film, are performed.

Such substrate processing processes are performed using a substrate processing apparatus. A substrate processing apparatus in the related art includes a chamber in which a substrate is processed, a pedestal supporting the substrate, and an electrode unit disposed above the pedestal. The substrate processing apparatus in the related art performs substrate processing processes by supplying gas to the substrate through the electrode unit.

The electrode unit of the substrate processing apparatus in the related art includes a first electrode including a plurality of protruding electrodes protruding toward the substrate and a second electrode provided with insertion holes through which the protruding electrodes extend. The protruding electrodes are designed to be located in the centers of the insertion holes.

During substrate processing processes carried out in the substrate processing apparatus, the temperature in the chamber is increased, and the first and second electrodes are thermally expanded due to an increase in temperature. In general, the second electrode closer to the pedestal heated by a heater has a higher temperature than the first electrode. Such a temperature difference leads to a difference in thermal expansion between the first electrode and the second electrode.

Due to the difference in coefficient of thermal expansion between the first electrode and the second electrode, the centers of the protruding electrodes may not be aligned with the centers of the insertion holes during such processing. In addition, as the difference in coefficient of thermal expansion increases in directions from central areas to edge areas of the first and second electrodes, the degree of misalignment between the centers of the protruding electrodes and the centers of the insertion holes may increase in directions from the central area to the edge area, so that the protruding electrodes and the insertion holes may be in contact with each other, thereby creating a short circuit.

Such a short circuit created between the first electrode and the second electrode may be problematic in that radio frequency (RF) power may not be supplied into the substrate processing apparatus and a uniform thin film may not be produced during the substrate processing processes.

SUMMARY

Various embodiments are directed to a substrate processing apparatus including a first electrode having a plurality of protruding electrodes protruding toward a substrate and a second electrode provided with a plurality of insertion holes through which the protruding electrodes extend. The positions of the protruding electrodes and the insertion holes are adjusted so that a short circuit created by contact between the first electrode and the second electrode may be prevented even in the case in which the first electrode and the second electrode are thermally expanded due to an increase in temperature during processing. The centers of the protruding electrodes are aligned with the centers of the insertion holes so that process gases may be uniformly injected from the first electrode and the second electrode.

In an embodiment, a substrate processing apparatus may include: a process chamber configured to provide a reaction space in which a substrate is processed; a first electrode disposed within the process chamber and including a plurality of protruding electrodes facing and protruding toward the substrate; and a second electrode disposed within the process chamber and provided with a plurality of insertion holes into which the protruding electrodes are inserted. The second electrode may have a central area, a peripheral area surrounding the central area, and an edge area surrounding the peripheral area. The protruding electrodes may be inserted into the insertion holes such that centers of the protruding electrodes are aligned with centers of the insertion holes in the central area, the centers of the protruding electrodes are spaced apart from the centers of the insertion holes by a first distance in directions away from the central area in the peripheral area, and the centers of the protruding electrodes are spaced apart from the centers of the insertion holes by a second distance in directions away from the central area in the edge area. The first distance may be shorter than the second distance.

In another embodiment, a substrate processing apparatus may include: a process chamber configured to provide a reaction space in which a substrate is processed; a first electrode disposed within the process chamber and including a plurality of protruding electrodes facing and protruding toward the substrate; and a second electrode disposed within the process chamber and provided with a plurality of insertion holes into which the protruding electrodes are inserted. The second electrode may have a central area, a peripheral area surrounding the central area, and an edge area surrounding the peripheral area. The protruding electrodes may be inserted into the insertion holes such that centers of the protruding electrodes are further spaced apart from centers of the insertion holes in directions from the central area to the edge area.

In still another embodiment, a substrate processing apparatus may include: a process chamber configured to provide a reaction space in which a substrate is processed; a first electrode disposed within the process chamber and including a plurality of protruding electrodes facing and protruding toward the substrate; and a second electrode disposed within the process chamber and provided with a plurality of insertion holes into which the protruding electrodes are inserted. The second electrode may have a central area, a peripheral area surrounding the central area, and an edge area surrounding the peripheral area. Shortest distances between outer circumferential surfaces of the protruding electrodes and inner circumferential surfaces of the insertion holes may decrease in directions from the central area to the edge area of the second electrode.

In yet another embodiment, a substrate processing apparatus may include: a process chamber configured to provide a reaction space in which a substrate is processed; a first injection plate disposed within the process chamber and including a plurality of protruding nozzles facing and protruding toward the substrate; and a second injection plate disposed within the process chamber and provided with a plurality of insertion holes into which the protruding nozzles are inserted. The second injection plate may have a central area, a peripheral area surrounding the central area, and an edge area surrounding the peripheral area. The protruding nozzles may be inserted into the insertion holes so as to be aligned with centers of the insertion holes in the central area, be spaced apart from the centers of the insertion holes by a first distance in directions away from the central area in the peripheral area, and be spaced apart from the centers of the insertion holes by a second distance in directions away from the central area in the edge area. The first distance may be shorter than the second distance.

In still yet another embodiment, a substrate processing apparatus may include: a process chamber configured to provide a reaction space in which a substrate is processed; a first injection plate disposed within the process chamber and including a plurality of protruding nozzles facing and protruding toward the substrate; and a second injection plate disposed within the process chamber and provided with a plurality of insertion holes into which the protruding nozzles are inserted. The second injection plate may have a central area, a peripheral area surrounding the central area, and an edge area surrounding the peripheral area. The protruding nozzles may be inserted into the insertion holes so as to be further spaced apart from centers of the insertion holes in directions from the central area to the edge area.

In further another embodiment, a substrate processing apparatus may include: a process chamber configured to provide a reaction space in which a substrate is processed; a first injection plate disposed within the process chamber and including a plurality of protruding nozzles facing and protruding toward the substrate; and a second injection plate disposed within the process chamber and provided with a plurality of insertion holes into which the protruding nozzles are inserted. The second injection plate may have a central area, a peripheral area surrounding the central area, and an edge area surrounding the peripheral area. Shortest distances between outer circumferential surfaces of the protruding nozzles and inner circumferential surfaces of the insertion holes may decrease in directions from the central area to the edge area of the second injection plate.

In a substrate processing apparatus according to the present disclosure, the centers of the protruding electrodes are located in the centers of the insertion holes in the central area of the second electrode and are located to be more offset from the centers of the insertion holes in directions from the central area to the edge area of the second electrode in the areas of the second electrode other than the central area. Thus, a short circuit may be prevented from being created by contact between the first electrode and the second electrode, even in the case in which the first electrode and the second electrode are thermally expanded due to an increase in temperature during processing. In addition, the uniformity of a thin film may be maintained in the substrate processing apparatus for processing a large substrate.

In another substrate processing apparatus according to the present disclosure, the centers of the protruding nozzles may be aligned with the centers of the insertion holes, even in the case in which the first injection plate and the second injection plate are thermally expanded due to an increase in temperature during processing. Thus, process gases are uniformly injected from the first injection plate and the second injection plate, so that the uniformity of a thin film may be maintained in the substrate processing apparatus for processing a large substrate.

DETAILED DESCRIPTION

During processing in the substrate processing apparatus, the temperature of a second electrode, i.e. a lower electrode, is typically higher than the temperature of a first electrode, i.e. an upper electrode. Thus, the first electrode and the second electrode have a difference in coefficient of thermal expansion due to the temperature difference.

Before the processing, predetermined distances are maintained between protruding electrodes of the first electrode and insertion holes of the second electrode. However, due to such a difference, the distances between the protruding electrodes and the insertion holes may not be uniform after the processing. In the case of a significant difference in thermal expansion, the protruding electrodes may come into contact with the insertion holes, thereby creating a short circuit.

According to The present disclosure, in order to prevent the above-described problems, the protruding electrodes and the insertion holes are disposed by adjusting the distances between the protruding electrodes and the insertion holes before processing, in consideration of the differences in thermal expansion between the protruding electrodes of the first electrode and the insertion holes of the second electrode. Thus, the centers of the protruding electrodes may be aligned with the centers of the insertion holes after thermal expansion.

Since the coefficient of thermal expansion is proportional to the temperature and length, the thermal expansion is not significant in the central areas of the first electrode and the second electrode but radially increases in directions from the central areas to the edge areas.

Accordingly, the first electrode and the second electrode may be disposed such that the centers of the protruding electrodes are located in the centers of the insertion holes in the central areas of the first electrode and the second electrode and are more offset from the centers of the insertion holes in directions from the central areas to the edge areas of the first electrode and the second electrode.

Exemplary embodiments of the present disclosure will be described below in detail with reference to the accompanying drawings.

Figure 1:
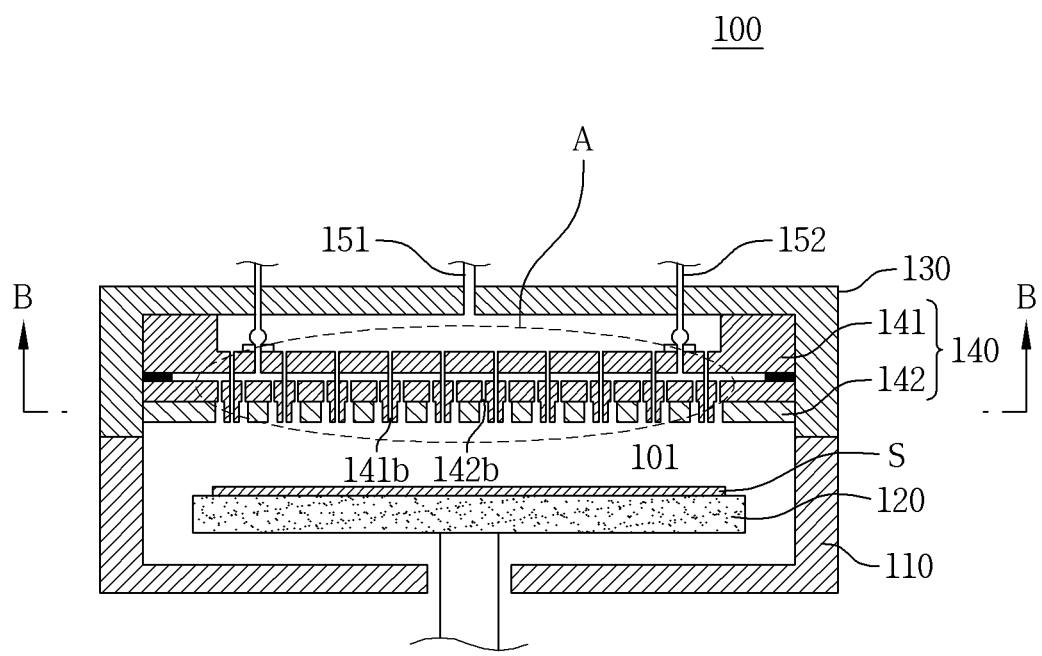
FIG. 1 is a cross-sectional view illustrating an embodiment of a substrate processing apparatus according to the present disclosure.

FIG. 1 is a cross-sectional view illustrating a substrate processing apparatus according to an embodiment of the present disclosure.

According to FIG. 1, a substrate processing apparatus 100 according to the present disclosure includes a process chamber 110, a pedestal 120, a chamber lid 130, and a gas injection module 140 facing the pedestal 120. The gas injection module 140 includes a first electrode 141 and a second electrode 142.

The process chamber 110 provides a reaction space 101 in which substrate processing processes are performed. Here, one portion of the bottom surface of the process chamber 110 may communicate with an outlet (not shown) through which the reaction space 101 is evacuated.

The pedestal 120 is disposed within the process chamber 110 and supports a plurality of substrates S or a single large substrate S. The pedestal 120 is supported by a support shaft (not shown) extending through the central portion of the bottom surface of the process chamber 110. Here, the support shaft exposed externally from the bottom surface of the process chamber 110 is hermetically sealed by a bellows (not shown) disposed on the bottom surface of the process chamber 110. In addition, the pedestal 120 may be moved up or down by a driving unit (not shown). In some cases, the pedestal 120 may be rotated by the driving of the driving unit.

The chamber lid 130 is disposed to cover the top portion of the process chamber 110 and hermetically seals the reaction space 101. The chamber lid 130 supports the gas injection module 140 including the first electrode 141, i.e. an upper electrode, and the second electrode 142, i.e. a lower electrode. The gas injection module 140 is inserted into and detachably coupled to the chamber lid 130.

A first gas supply (not shown) and a second gas supply (not shown) for supplying a first gas and a second gas to the gas injection module 140 within the process chamber 110 may be provided on the top surface of the chamber lid 130.

The first gas supply (not shown) supplies a reaction gas, i.e. the first gas, to the gas injection module 140 through a first gas supply line 151. The reaction gas refers to a plasma-forming gas or a gas for a secondary reaction. For example, the reaction gas may contain hydrogen ($H_2$), nitrogen ($N_2$), oxygen ($O_2$), nitrogen dioxide ($NO_2$), ammonia ($NH_3$), water ($H_2O$), ozone ($O_3$), and the like.

The second gas supply (not shown) supplies a source gas, i.e. the second gas, to the gas injection module 140 through a second gas supply line 152. The source gas refers to a gas containing main ingredients of a thin film to be formed. For example, the source gas may be a gas of silicon (Si), titanium family elements (e.g. Ti, Zr, and Hf), aluminum (Al), or the like.

A plasma power supply (not shown) for supplying plasma power may be disposed outside the process chamber 110.

The first electrode 141 and the second electrode 142 of the gas injection module 140 may be detachably coupled to the top portion of the process chamber so as to face the pedestal 120.

The first electrode 141 may serve as a first injection plate to inject the first gas into the reaction space, while the second electrode 142 may serve as a second injection plate to inject the second gas into the reaction space.

The first electrode 141 includes a plurality of protruding electrodes 141a disposed within the process chamber and protruding toward the substrate S.

The first electrode 141 may be provided with a plurality of first gas injection holes 141b through which the first gas supplied from the first gas supply (not shown) through the first gas supply line 151 may be injected to the substrate S.

Although FIG. 1 illustrates that the first gas injection holes 141b are illustrated as being provided in the protruding electrodes 141a, the first gas injection holes 141b may not be provided in the protruding electrodes 141a, but be provided in portions of the first electrode 141 other than the protruding electrodes 141a in some cases.

In this case, the first gas may be injected to the substrate S or may be injected from between the protruding electrodes 141a and insertion holes 142a depending on the length of the protruding electrodes 141a.

The structure of the first electrode 141 may have the shape of a polygonal plate, a circular plate, or the like. The protruding electrodes 141a may be integrated with or be detachable from the first electrode 141, and may be connected to the first electrode 141 to have the same voltage as the first electrode 141.

The second electrode 142 may be provided with a plurality of second gas injection holes 142b through which the second gas supplied through the second gas supply line 152 may be injected to the substrate S.

The structure of the second electrode 142 may have the shape of a polygonal plate, a circular plate, or the like. The second electrode 142 may be provided within the process chamber and have the plurality of insertion holes 142a through which the protruding electrodes 141a extend.

Figure 2:
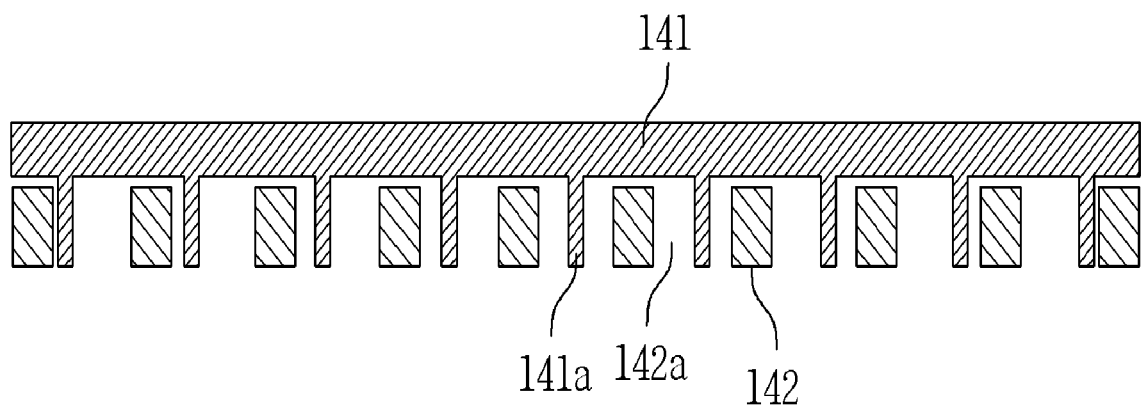
FIG. 2 is an enlarged view illustrating portion A of the substrate processing apparatus according to the embodiment illustrated in FIG. 1, prior to thermal expansion.
Figure 3:
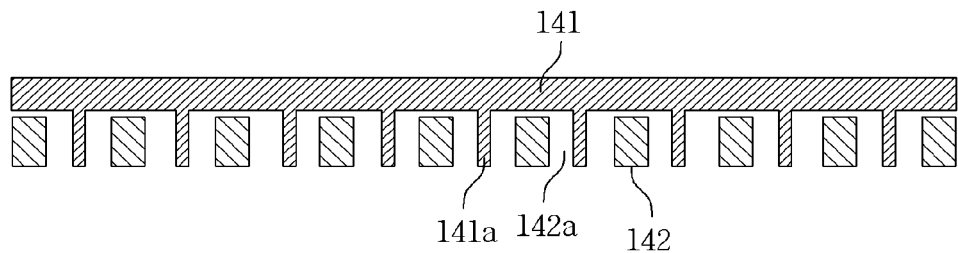
FIG. 3 is an enlarged view illustrating portion A of the substrate processing apparatus according to the embodiment illustrated in FIG. 1, after the thermal expansion.
Figure 4:
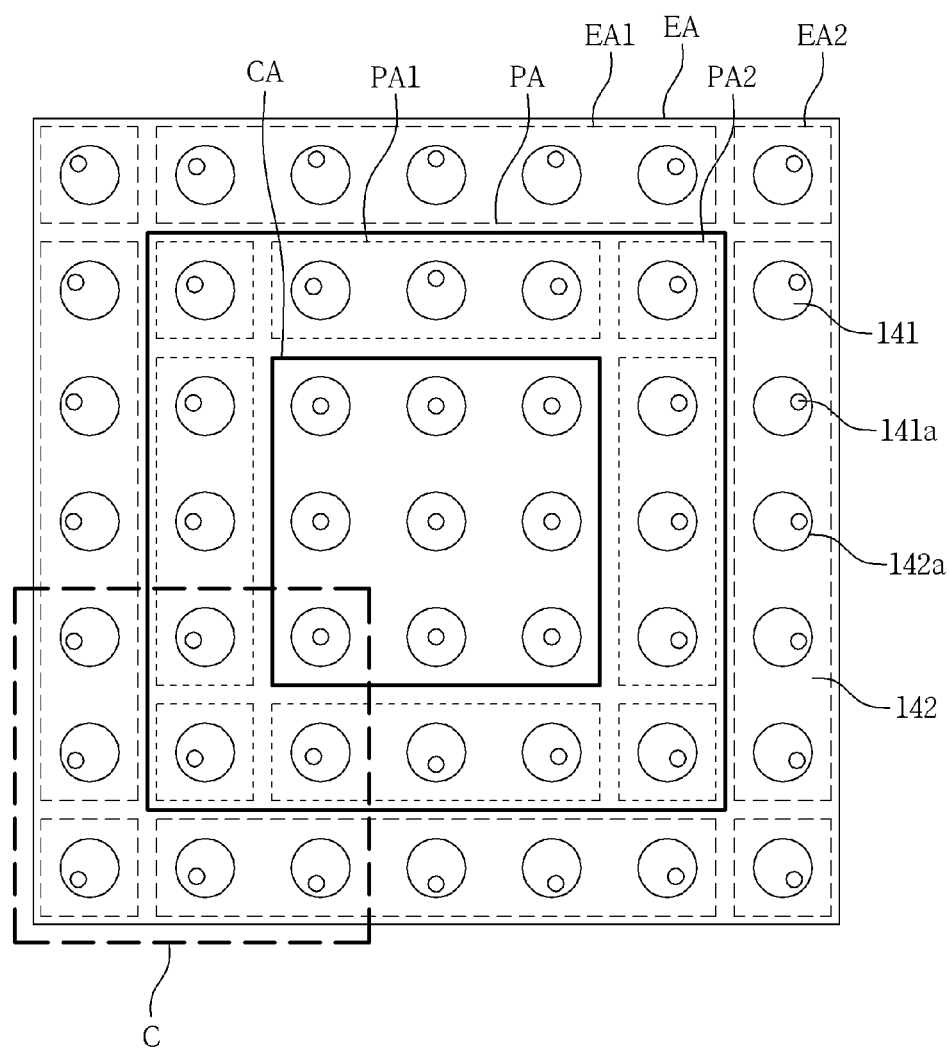
FIG. 4 is a plan view illustrating the substrate processing apparatus according to the embodiment illustrated in FIG. 1, taken along line B-B, prior to the thermal expansion.
Figure 6:
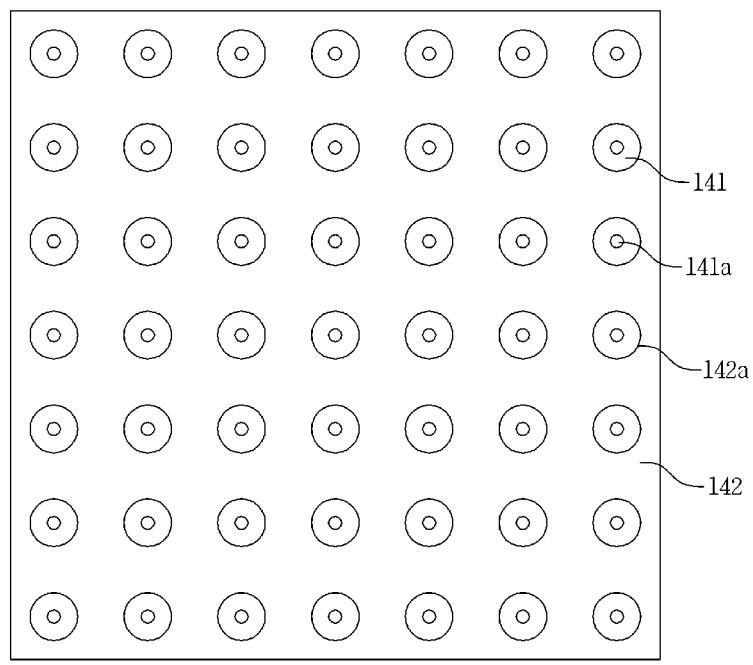
FIG. 6 is a plan view illustrating the substrate processing apparatus according to the embodiment illustrated in FIG. 1, taken along line B-B, after the thermal expansion.

FIGS. 2 and 3 are enlarged views of portion "A" of the substrate processing apparatus according to the embodiment illustrated in FIG. 1, while FIGS. 4 and 6 are plan views of the substrate processing apparatus according to the embodiment illustrated in FIG. 1, taken along line B-B.

FIGS. 2 to 6 relate to an embodiment of the electrodes including the first electrode and the second electrode, in which none of the first gas injection holes 141b and the second gas injection holes 142b is shown for simplification of the drawings and convenience of description. An embodiment relating to a gas injection plate including the first gas injection holes 141b and the second gas injection holes 142b will be described later.

Referring to FIG. 2, in the substrate processing apparatus according to the present disclosure, it may be appreciated that the protruding electrodes 141a are located in the centers of the insertion holes 142a in a central area of the second electrode 142 but are formed to be more offset from the centers of the insertion holes 142a toward outer portions of the inner circumferential surfaces of the insertion holes 142a in directions from the central area to an edge area of the second electrode 142.

As described above, the positions of the protruding electrodes 141a are set to be more offset from the centers of the insertion holes 142a in directions from the central area to the edge area of the second electrode 142. Thus, after the thermal expansion due to the processes is completed, the protruding electrodes 141a may be located in the centers of the insertion holes 142a as illustrated in FIG. 3, thereby preventing a short circuit between the protruding electrodes 141a and the insertion holes 142a.

Figure 5:
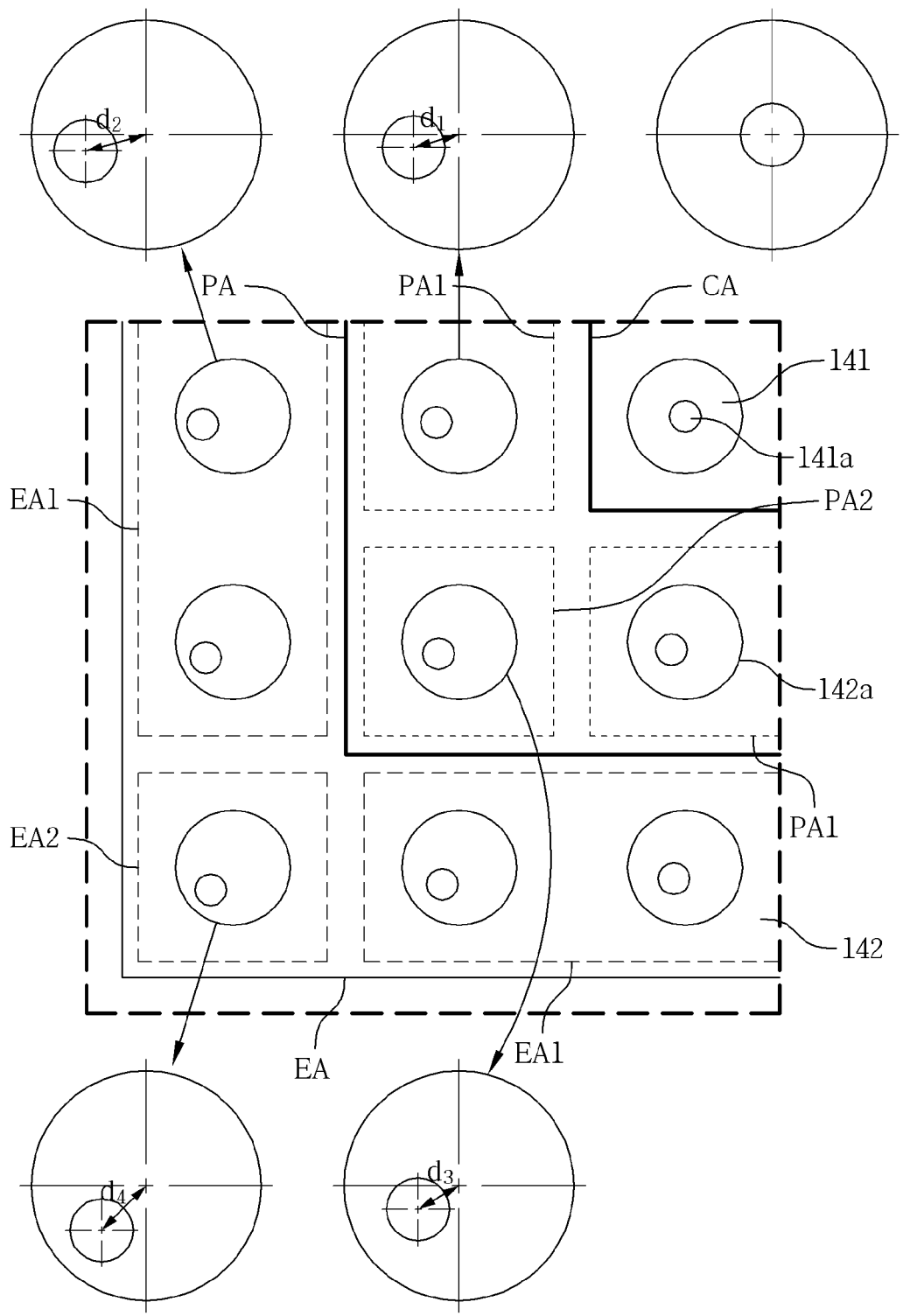
FIG. 5 is an enlarged view illustrating portion C in FIG. 4.

Referring to FIGS. 4 and 5, the second electrode 142 of the substrate processing apparatus according to the present disclosure includes a central area CA, a peripheral area PA surrounding the central area CA, and an edge area EA surrounding the peripheral area PA.

In the central area CA, the protruding electrodes 141a are inserted into the insertion holes 142a such that the centers of the protruding electrodes 141a are aligned with the centers of the insertion holes 142a.

In the peripheral area PA, the protruding electrodes 141a are inserted into the insertion holes 142a such that the centers of the protruding electrodes 141a are spaced apart from the centers of the insertion holes 142a by a first distance d1 in directions away from the central area CA.

In the edge area EA, the protruding electrodes 141a are inserted into the insertion holes 142a such that the centers of the protruding electrodes 141a are spaced apart from the centers of the insertion holes 142a by a second distance d2 in directions away from the central area CA.

Here, the first distance may be set to be smaller than the second distance, in consideration of differences in coefficients of thermal expansion according to temperature and length.

That is, in the substrate processing apparatus according to the embodiment, the protruding electrodes 141a are inserted into the insertion holes 142a such that the centers of the protruding electrodes 141a are further spaced apart from the centers of the insertion holes 142a in directions from the central area CA to the edge area EA.

In addition, in the substrate processing apparatus according to the embodiment, the protruding electrodes 141a are inserted into the insertion holes 142a such that the distance between a portion of the inner circumferential surface of each of the insertion holes 142a, located opposite to the central area CA, and a portion of the outer circumferential surface of the corresponding protruding electrode 141a decreases in directions from the central area CA to the edge area EA.

Meanwhile, the peripheral area PA includes a first peripheral area PA1 and a second peripheral area PA2.

In the first peripheral area PA1, the protruding electrodes 141a are inserted into the insertion holes 142a such that the centers of the protruding electrodes 141a are spaced apart from the centers of the insertion holes 142a by the first distance d1 in directions away from the central area CA.

In the second peripheral area PA2, the protruding electrodes 141a are inserted into the insertion holes 142a such that the centers of the protruding electrodes 141a are spaced apart from the centers of the insertion holes 142a by a third distance d3 in directions away from the central area CA.

Here, the first distance d1 may be set to be equal to or smaller than the third distance d3, in consideration of differences in coefficients of thermal expansion according to temperature and length.

Meanwhile, the edge area EA includes a first edge area EA1 and a second edge area EA2.

In the first edge area EA1, the protruding electrodes 141a are inserted into the insertion holes 142a such that the centers of the protruding electrodes 141a are spaced apart from the centers of the insertion holes 142a by the second distance d2 in directions away from the central area CA.

In the second edge area EA2, the protruding electrodes 141a are inserted into the insertion holes 142a such that the centers of the protruding electrodes 141a are spaced apart from the centers of the insertion holes 142a by a fourth distance d4 in directions away from the central area CA.

Here, the second distance d2 may be set to be equal to or smaller than the fourth distance d4, in consideration of differences in coefficients of thermal expansion according to temperature and length.

According to the present disclosure, the first distance d1 may be defined as a center-to-center distance between the protruding electrodes 141a and the insertion holes 142a in the first peripheral area PA1, the second distance d2 may be defined as a center-to-center distance between the protruding electrode 141a and the insertion hole 142a in the first edge area EA1, the third distance d3 may be defined as a center-to-center distance between the protruding electrode 141a and the insertion hole 142a in the second peripheral area PA2, and the fourth distance d4 may be defined as a center-to-center distance between the protruding electrode 141a and the insertion hole 142a in the second edge area EA2.

Here, the third distance d3 may be set to be equal to or smaller than the second distance d2 and be smaller than the fourth distance d4, in consideration of differences in coefficients of thermal expansion according to temperature and length.

In the substrate processing apparatus according to the present disclosure, the area of the second electrode is divided into the central area CA, the first peripheral area PA1 and the second peripheral area PA1, and the first edge area EA1 and the second edge area EA2. The positions of the protruding electrodes 141a are set to be more offset from the centers of the insertion holes 142a in directions from the central area CA to the first peripheral area PA1 and the second peripheral area PA1 and to the first edge area EA1 and the second edge area EA2. Thus, after the thermal expansion due to the processes is completed, the protruding electrodes 141a may be located in the centers of the insertion holes 142a as illustrated in FIG. 6, thereby preventing a short circuit between the protruding electrodes 141a and the insertion holes 142a.

Figure 7:
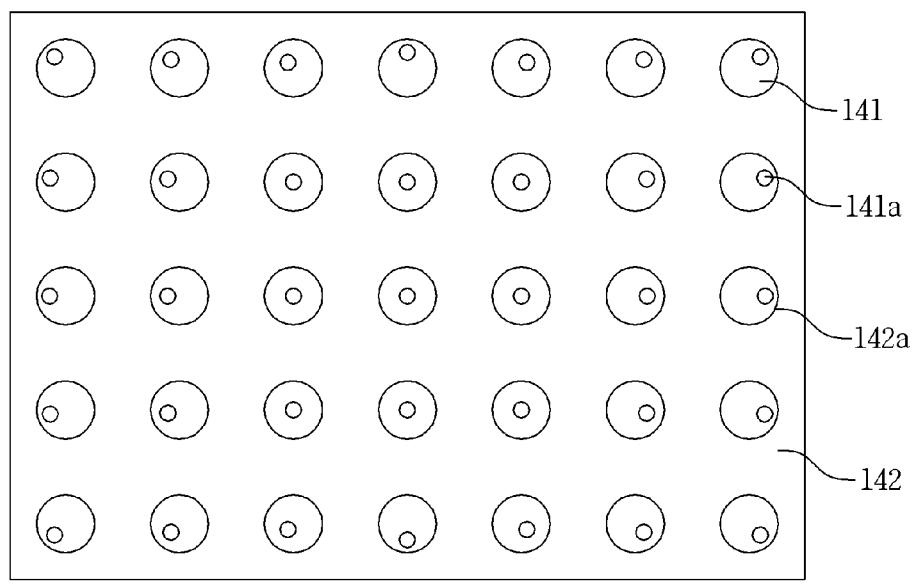
FIG. 7 is a plan view illustrating another embodiment of the substrate processing apparatus illustrated in FIG. 1, taken along line B-B, prior to thermal expansion.
Figure 8:
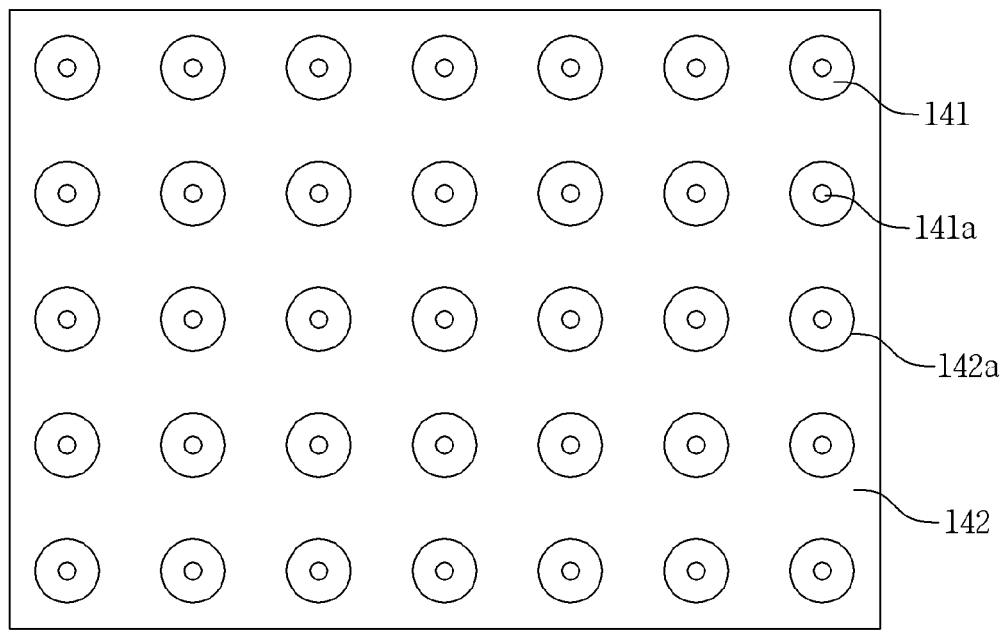
FIG. 8 is a plan view illustrating another embodiment of the substrate processing apparatus illustrated in FIG. 1, taken along line B-B, after the thermal expansion.

FIG. 7 illustrates the first electrode 141 and the second electrode 142 having the shape of a rectangular plate prior to thermal expansion, while FIG. 8 illustrates the first electrode 141 and the second electrode 142 after the thermal expansion is completed.

Figure 9:
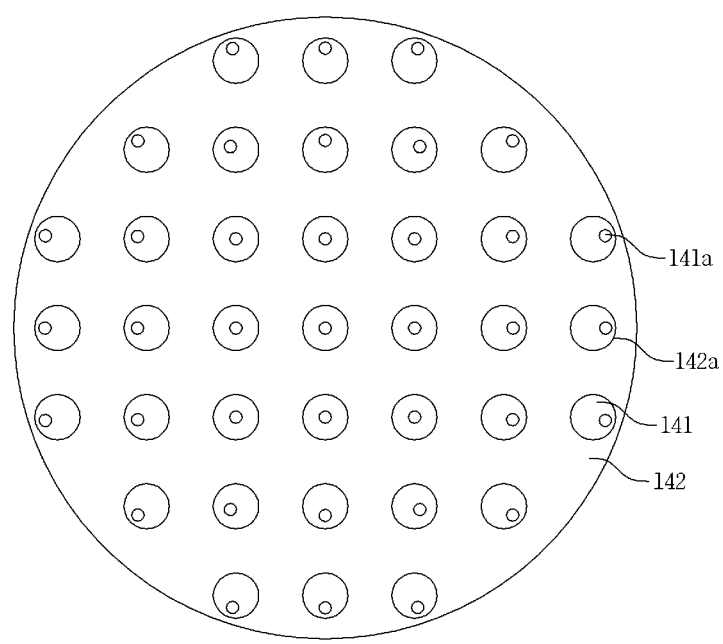
FIG. 9 is a plan view illustrating another embodiment of the substrate processing apparatus illustrated in FIG. 1, taken along line B-B, prior to thermal expansion.
Figure 10:
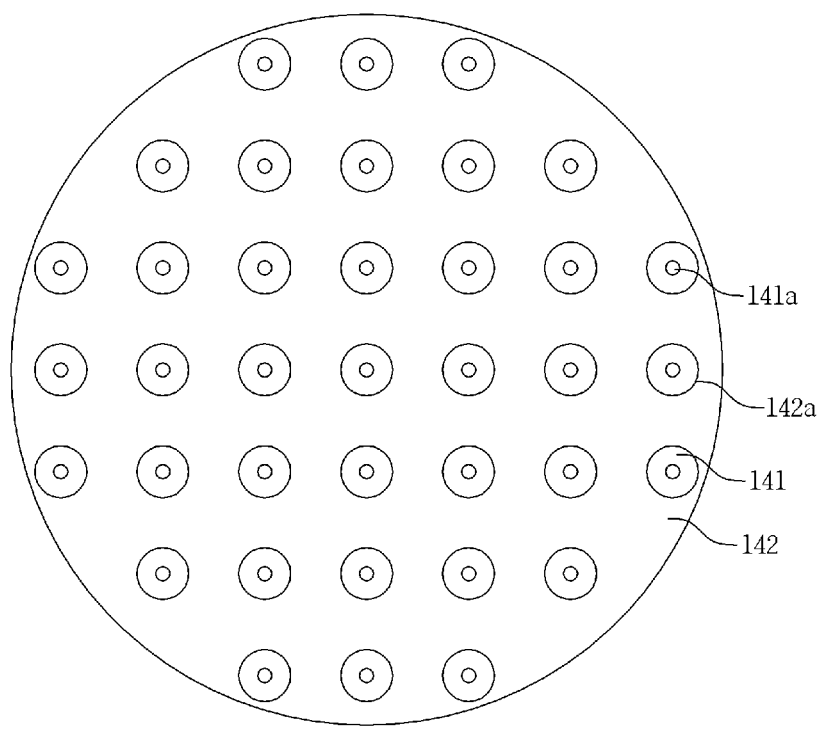
FIG. 10 is a plan view illustrating another embodiment of the substrate processing apparatus illustrated in FIG. 1, taken along line B-B, after the thermal expansion.

FIG. 9 illustrates the first electrode 141 and the second electrode 142 having the shape of a circular plate prior to thermal expansion, while FIG. 10 illustrates the first electrode 141 and the second electrode 142 after the thermal expansion is completed.

Although FIGS. 4 to 10 illustrate that the protruding electrodes 141a and the insertion holes 142a respectively have a circular cross-section, the protruding electrodes 141a and the insertion holes 142a are not limited thereto and may have a variety of other shapes, such as a rectangular shape.

In the substrate processing apparatus according to the present invention, the process chamber has room temperature.

Figure 11:
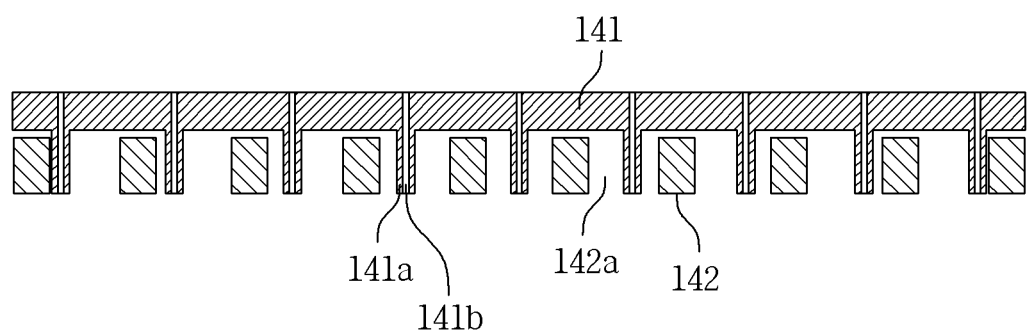
FIG. 11 is an enlarged view illustrating portion A of another embodiment of the substrate processing apparatus illustrated in FIG. 1, prior to thermal expansion.
Figure 12:
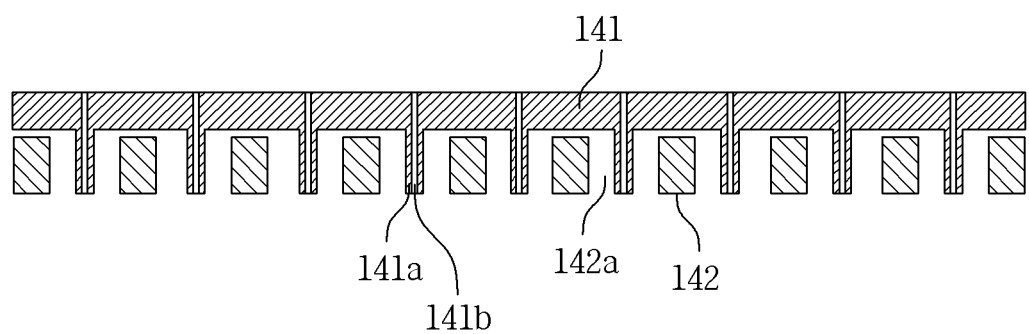
FIG. 12 is an enlarged view illustrating portion A of another embodiment of the substrate processing apparatus illustrated in FIG. 1, after the thermal expansion.

FIG. 11 is an enlarged view illustrating portion A of another embodiment of the substrate processing apparatus illustrated in FIG. 1, prior to thermal expansion, while FIG. 12 illustrates portion A after the thermal expansion.

FIGS. 2 and 3 relate to the embodiment of the electrodes including the first electrode and the second electrode, whereas FIGS. 11 and 12 illustrate the embodiment of the gas injection plate including the first gas injection holes 141b and the second gas injection holes 142b and injecting a gas into the reaction space.

The configuration of FIG. 11 is the same as that of FIG. 2, except that the first electrode serves as a first injection plate 141 including the first gas injection holes 141b and protruding nozzles 141a and the second electrode serves as a second injection plate 142 including the insertion holes 142a and the second gas injection holes (not shown).

Hereinafter, another embodiment of the present disclosure will be described with reference to FIGS. 11 and 12 together with FIGS. 4 to 6.

The substrate processing apparatus according to another embodiment of the present disclosure includes the process chamber 110 providing a reaction space in which substrate processing processes are performed, the first injection plate 141 disposed within the process chamber and including the plurality of protruding nozzles 141a facing and protruding toward the substrate S, and the second injection plate 142 disposed within the process chamber and provided with the plurality of insertion holes 142a into which the protruding nozzles 141a are inserted.

The second injection plate 142 includes the central area CA, the peripheral area PA surrounding the central area CA, and the edge area EA surrounding the peripheral area PA.

In the central area CA, the protruding nozzles 141a are inserted into the insertion holes 142a so as to be aligned with the centers of the insertion holes 142a.

In the peripheral area PA, the protruding nozzles 141a are inserted into the insertion holes 142a so as to be spaced apart from the centers of the insertion holes 142a by a first distance d1 in directions away from the central area CA.

In the edge area EA, the protruding nozzles 141a are inserted into the insertion holes 142a so as to be spaced apart from the centers of the insertion holes 142a by a second distance d2 in directions away from the central area CA.

Here, the first distance d1 may be set to be smaller than the second distance d2, in consideration of differences in coefficients of thermal expansion according to temperature and length.

That is, in the substrate processing apparatus according to another embodiment of the present disclosure, the protruding nozzles 141a are inserted into the insertion holes 142a such that the centers of the protruding nozzles 141a are further spaced apart from the centers of the insertion holes 142a in directions from the central area CA to the edge area EA.

In addition, in the substrate processing apparatus according to another embodiment of the present disclosure, the protruding nozzles 141a are inserted into the insertion holes 142a such that the distance between a portion of the inner circumferential surface of each of the insertion holes 142a, located opposite to the central area CA, and a portion of the outer circumferential surface of the corresponding protruding nozzle 141a decreases in directions from the central area CA to the edge area EA.

In addition, although the protruding electrodes 141a illustrated in FIG. 2 and the protruding nozzles 141a illustrated in FIG. 11 are typically inserted into the insertion holes 142a, the protruding electrodes 141a and the protruding nozzles 141a may not be inserted into the insertion holes 142a depending on processing conditions.

Even in a case in which the protruding nozzles 141a are not inserted into the insertion holes 142a, a thin film having uniform quality may not be formed when the positions of the protruding nozzles are offset from the centers of the insertion holes 142a due to thermal expansion. Accordingly, a process of adjusting the positions of the protruding nozzles prior to processing as in the present disclosure is required.

As set forth above, in the substrate processing apparatus according to the present disclosure, the protruding electrodes are located in the centers of the insertion holes of the second electrode in the central area and are located in positions more offset from the centers in directions from the central area to the edge area, in consideration of differences in thermal expansion according to the temperatures of the electrodes and the distances from the center of the second electrode.

Accordingly, in the present disclosure, after thermal expansion is completed, the centers of the protruding electrodes are aligned with the centers of the insertion holes so that a short between the protruding electrodes and the insertion holes may be prevented, thereby maintaining the uniformity of a thin film in the substrate processing apparatus.

While the exemplary embodiments of the present invention have been described in detail, those skilled in the art will appreciate that various modifications, additions, and substitutions are possible, without departing from the scope and the spirit of the present disclosure as defined in the accompanying claims.

What is claimed is:

1. A substrate processing apparatus comprising:
a process chamber configured to provide a reaction space in which a substrate is processed;
a first electrode disposed within the process chamber and including a plurality of protruding electrodes facing and protruding toward the substrate; and
a second electrode disposed within the process chamber and provided with a plurality of insertion holes into which the protruding electrodes are inserted,
wherein the second electrode has a central area, a peripheral area surrounding the central area, and an edge area surrounding the peripheral area,
wherein the protruding electrodes are inserted into the insertion holes such that centers of the protruding electrodes are aligned with centers of the insertion holes in the central area, the centers of the protruding electrodes are spaced apart from the centers of the insertion holes along a direction to which the second electrode extends by a first distance in directions away from the central area in the peripheral area, and the centers of the protruding electrodes are spaced apart from the centers of the insertion holes along the direction to which the second electrode extends by a second distance in directions away from the central area in the edge area, and
wherein the first distance is shorter than the second distance.

2. The substrate processing apparatus according to claim 1, wherein the process chamber has room temperature.

3. The substrate processing apparatus according to claim 1, wherein the peripheral area includes a first peripheral area and a second peripheral area, and
wherein the protruding electrodes are inserted into the insertion holes such that the centers of the protruding electrodes are spaced apart from the centers of the insertion holes by the first distance in directions away from the central area in the first peripheral area and the centers of the protruding electrodes are spaced apart from the centers of the insertion holes by a third distance in directions away from the central area in the second peripheral area, and wherein the first distance is equal to or shorter than the third distance.

4. The substrate processing apparatus according to claim 3, wherein the edge area includes a first edge area and a second edge area, and wherein the protruding electrodes are inserted into the insertion holes such that the centers of the protruding electrodes are spaced apart from the centers of the insertion holes by the second distance in directions away from the central area in the first edge area, and the centers of the protruding electrodes are spaced apart from the centers of the insertion holes by a fourth distance in directions away from the central area in the second edge area, and wherein the second distance is equal to or shorter than the fourth distance.

5. The substrate processing apparatus according to claim 4, wherein the third distance is equal to or shorter than the second distance and is shorter than the fourth distance.

6. A substrate processing apparatus comprising:

a process chamber configured to provide a reaction space in which a substrate is processed;

a first electrode disposed within the process chamber and including a plurality of protruding electrodes facing and protruding toward the substrate; and a second electrode disposed within the process chamber and provided with a plurality of insertion holes into which the protruding electrodes are inserted, wherein the second electrode has a central area, a peripheral area surrounding the central area, and an edge area surrounding the peripheral area, and wherein the protruding electrodes are inserted into the insertion holes such that centers of the protruding electrodes are further spaced apart from centers of the insertion holes along a direction to which the second electrode extends in directions from the central area to the edge area.

7. The substrate processing apparatus according to claim 6, wherein the process chamber has room temperature.

8. A substrate processing apparatus comprising:

a process chamber configured to provide a reaction space in which a substrate is processed;

a first electrode disposed within the process chamber and including a plurality of protruding electrodes facing and protruding toward the substrate; and a second electrode disposed within the process chamber and provided with a plurality of insertion holes into which the protruding electrodes are inserted, wherein the second electrode has a central area, a peripheral area surrounding the central area, and an edge area surrounding the peripheral area, and wherein shortest distances between outer circumferential surfaces of the protruding electrodes and inner circumferential surfaces of the insertion holes decrease along a direction to which the second electrode extends in directions from the central area to the edge area of the second electrode.

9. The substrate processing apparatus according to claim 8, wherein the shortest distances between the outer circumferential surfaces of the protruding electrodes and the inner circumferential surfaces of the insertion holes are distances between the outer circumferential surfaces of the protruding electrodes and the inner circumferential surfaces of the corresponding insertion holes, located opposite to the central area.

10. The substrate processing apparatus according to claim 8, wherein the process chamber has room temperature.

* * * * *